(12) United States Patent
Matsuno et al.

(10) Patent No.: US 7,417,885 B2
(45) Date of Patent: Aug. 26, 2008

(54) DATA CARRIER SYSTEM AND DATA SAVING/RESTORING METHOD THEREOF

(75) Inventors: Noriaki Matsuno, Hyogo (JP); Atsuo Inoue, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 11/601,800

(22) Filed: Nov. 20, 2006

(65) Prior Publication Data

US 2007/0121366 A1 May 31, 2007

(30) Foreign Application Priority Data

Nov. 22, 2005 (JP) .............................. 2005-337595

(51) Int. Cl.
*G11C 11/22* (2006.01)

(52) U.S. Cl. .................. 365/145; 365/230.06

(58) Field of Classification Search .................. 365/145, 365/230.06
See application file for complete search history.

(56) References Cited

U.S. PATENT DOCUMENTS

| | | | |
|---|---|---|---|
| 5,519,663 A | 5/1996 | Harper et al. | |
| 6,046,927 A | 4/2000 | Lee et al. | |
| 7,046,541 B2 | 5/2006 | Ogiwara et al. | |
| 2004/0036111 A1* | 2/2004 | Nishikawa et al. | 257/316 |
| 2005/0063225 A1* | 3/2005 | Takashima | 365/199 |
| 2005/0104101 A1 | 5/2005 | Schultz et al. | |

FOREIGN PATENT DOCUMENTS

| | | |
|---|---|---|
| JP | 2003-076953 | 3/2003 |
| JP | 2004-342170 | 12/2004 |

OTHER PUBLICATIONS

European Search Report in corresponding to European Patent Application No. 06124560.1 dated on Jun. 6, 2007.

* cited by examiner

*Primary Examiner*—Michael T Tran
(74) *Attorney, Agent, or Firm*—McDermott Will & Emery LLP

(57) ABSTRACT

A data carrier system includes: a first memory, which is a ferroelectric memory; a second memory; a polarization canceling circuit for canceling polarization of the first memory in accordance with an instruction given thereto; and a control circuit for making data access to the first and second memories and controlling operation of the polarization canceling circuit. Upon receipt of a first instruction, the control circuit saves data stored in the first memory to the second memory and then gives an instruction for canceling polarization to the polarization canceling circuit, while upon receipt of a second instruction, the control circuit writes the data saved to the second memory back into the first memory.

16 Claims, 12 Drawing Sheets

DATA CARRIER SYSTEM AND DATA SAVING/RESTORING METHOD THEREOF

CROSS-REFERENCE TO RELATED APPLICATION

The disclosure of Japanese Patent Application No. 2005-337595 filed on Nov. 22, 2005 including specification, drawings and claims is incorporated herein by reference in its entirety.

BACKGROUND OF THE INVENTION

The present invention relates to a data carrier system including a ferroelectric memory.

A ferroelectric memory is an excellent non-volatile memory, operating at high speed, consuming little electricity, and having a long repeatability life, and is thus regarded as having great potential in the multimedia society. In recent years, multimedia products with built-in ferroelectric memories have been flooding the market, and the number of such products is increasing every year. Data carriers are one of those products.

However, when currently available ferroelectric memories are left to stand in high temperature environments, the data retention characteristics thereof deteriorate, which may results in data loss. The data retention characteristics of a ferroelectric memory might therefore deteriorate in a high temperature treatment process, such as a process for forming an IC, a process for mounting onto a semiconductor chip, and a reflow process.

Conventionally, in order to restore the degraded data retention characteristics, a reader/writer reads data from the ferroelectric memory properly and writes the data back into the ferroelectric memory, thereby refreshing the ferroelectric memory (see, for example, FIGS. 2 and 4 in page 5 in Japanese Laid-Open Publication No. 2003-76953).

Nevertheless, the refresh operation according to the above-described conventional technique cannot be practically performed in high temperature environments in which the temperature is as high as the Curie temperature, because data to be refreshed has already been lost from the ferroelectric memory in such high temperature environments. Therefore, the operating temperature condition for the conventional data carrier system is limited to below the temperature at which the polarization can maintained enough to be refreshed.

Furthermore, when a ferroelectric memory is left to stand in high temperature environments, imprint degradation, which makes rewriting of data difficult, occurs to cause decrease in the reliability. With the conventional technique described above, the problem of imprint degradation cannot be addressed sufficiently.

SUMMARY OF THE INVENTION

In view of the above problems, it is therefore an object of the present invention to provide a data carrier system including a ferroelectric memory, in which the problems of data retention characteristic deterioration, data loss, and imprint degradation, occurring particularly in high temperature environments, are overcome.

In order to achieve the object, an inventive data carrier includes: a ferroelectric memory, a polarization canceling circuit for canceling polarization of the ferroelectric memory in accordance with an instruction given thereto, and a control circuit for making data access to the ferroelectric memory and controlling operation of the polarization canceling circuit, wherein upon receipt of a first instruction, the control circuit saves data stored in the ferroelectric memory to a second memory and then gives an instruction for canceling polarization to the polarization canceling circuit, while upon receipt of a second instruction, the control circuit writes the data saved to the second memory back into the ferroelectric memory.

In the inventive data carrier, when the first instruction is given to the control circuit, the control circuit saves the data stored in the ferroelectric memory to the second memory, and then the polarization canceling circuit cancels the polarization of the ferroelectric memory. When the second instruction is given to the control circuit, the control circuit writes the data saved to the second memory back into the ferroelectric memory. Therefore, where there is a risk that the data stored in the ferroelectric memory may be lost, for example, where the data carrier is treated in a high temperature treatment process or the like, the data stored in the ferroelectric memory is saved to the second memory, before the polarization of the ferroelectric memory is cancelled. And after the risk is eliminated, the data saved to the second memory is written back to the ferroelectric memory, whereby deterioration in data retention characteristics, data loss, and imprint degradation are all prevented in the ferroelectric memory.

When the control circuit gives the instruction for canceling polarization, the control circuit preferably permits writing of data into the ferroelectric memory.

The polarization canceling circuit preferably cancels the polarization of the ferroelectric memory except for polarization of a special area formed in the ferroelectric memory.

Specifically, the data carrier includes, as the second memory, a memory which is other than a ferroelectric memory.

The data carrier preferably further includes a memory switching circuit for switching between the ferroelectric memory and the second memory as a memory for dealing with external data access.

The data carrier preferably includes a fuse ROM, wherein upon receipt of the second instruction, the control circuit writes data stored in the fuse ROM into the ferroelectric memory.

More preferably, the fuse ROM stores encoded data; the data carrier includes a decoding circuit for decoding the encoded data; and upon receipt of the second instruction, the control circuit writes data decoded by the decoding circuit into the ferroelectric memory.

The data carrier preferably includes a capacitor which is charged with power supply voltage of the data carrier, wherein the polarization canceling circuit is operated with discharge voltage of the capacitor.

The data carrier preferably includes a temperature sensor for measuring temperature of the ferroelectric memory, outputting the first instruction when the temperature exceeds a predetermined value, and outputting the second instruction when the temperature falls below a predetermined value.

More preferably, the data carrier further includes a power source for supplying operating power for the data carrier.

Another inventive data carrier includes: a ferroelectric memory, and a control circuit for controlling access to the ferroelectric memory and cancellation of polarization of the ferroelectric memory, wherein upon receipt of a first instruction, the control circuit saves data stored in the ferroelectric memory to a second memory and then cancels the polarization of the ferroelectric memory by using an externally supplied voltage, while upon receipt of a second instruction, the control circuit writes the data saved to the second memory back into the ferroelectric memory.

In the inventive data carrier, when the first instruction is given to the control circuit, the control circuit saves the data stored in the ferroelectric memory to the second memory, and then cancels the polarization of the ferroelectric memory by using an externally supplied voltage. When the second instruction is given to the control circuit, the control circuit writes the data saved to the second memory back into the ferroelectric memory. Therefore, where there is a risk that the data stored in the ferroelectric memory may be lost, for example, where the data carrier is treated in a high temperature treatment process or the like, the data stored in the ferroelectric memory is saved to the second memory, before the polarization of the ferroelectric memory is cancelled. And after the risk is eliminated, the data saved to the second memory is written back to the ferroelectric memory, whereby deterioration in data retention characteristics, data loss, and imprint degradation are all prevented in the ferroelectric memory.

Another inventive data carrier includes: a ferroelectric memory, a polarization canceling circuit for canceling polarization of the ferroelectric memory in accordance with an instruction given thereto; a data generation circuit for generating predetermined data in accordance with an instruction given thereto; and a control circuit for making data access to the ferroelectric memory and controlling operation of the polarization canceling circuit and operation of the data generation circuit, wherein upon receipt of a first instruction, the control circuit gives an instruction for canceling polarization to the polarization canceling circuit, while upon receipt of a second instruction, the control circuit gives an instruction for generating data to the data generation circuit and writes the predetermined data generated by the data generation circuit into the ferroelectric memory.

Another inventive data carrier includes: a ferroelectric memory; a data generation circuit for generating predetermined data in accordance with an instruction given thereto; and a control circuit for controlling access to the ferroelectric memory, operation of the data generation circuit, and cancellation of polarization of the ferroelectric memory, wherein upon receipt of a first instruction, the control circuit cancels the polarization of the ferroelectric memory by using an externally supplied voltage, while upon receipt of a second instruction, the control circuit gives an instruction for generating data to the data generation circuit and writes the predetermined data generated by the data generation circuit into the ferroelectric memory.

In an inventive reader/writer for a data carrier including a ferroelectric memory, the data carrier includes a temperature sensor for measuring temperature of the ferroelectric memory, outputting a first signal when the temperature exceeds a predetermined value, and outputting a second signal when the temperature falls below a predetermined value; the reader/writer includes: a memory, a control circuit for controlling access to the memory, and an inverting circuit for inverting data read from the memory to generate inverted data; and upon receipt of the first signal, the control circuit saves data stored in the ferroelectric memory to the memory and then writes the data stored in the memory and the inverted data alternately into the ferroelectric memory, while upon receipt of the second signal, the control circuit writes the data stored in the memory into the ferroelectric memory.

In the inventive reader/writer, when the temperature of the ferroelectric memory exceeds a predetermined value, the control circuit saves the data stored in the ferroelectric memory to the memory in the reader/writer and then writes the saved data and the inverted data thereof alternately into the ferroelectric memory until the temperature of the ferroelectric memory falls below a predetermined value. Therefore, while the temperature of the ferroelectric memory is higher than the predetermined value, it is possible to suppress imprint degradation in the ferroelectric memory from proceeding. And when the temperature of the ferroelectric memory falls below the predetermined value, it is possible to restore the saved data in the ferroelectric memory, whereby deterioration in data retention characteristics, data loss, and imprint degradation are all prevented in the ferroelectric memory.

In an inventive reader/writer for a data carrier including a ferroelectric memory, the data carrier includes a temperature sensor for measuring temperature of the ferroelectric memory, outputting a first signal when the temperature exceeds a predetermined value, and outputting a second signal when the temperature falls below a predetermined value; the reader/writer includes: a memory, a control circuit for controlling access to the memory, an inverting circuit for inverting data read from the memory to generate inverted data, and a thermal stress calculation circuit for estimating a total amount of thermal stress applied to the ferroelectric memory by performing time integration of the temperature of the ferroelectric memory measured by the temperature sensor for a period of time from when the thermal stress calculation circuit receives the first signal to when the thermal stress calculation circuit receives the second signal, and calculating a length of time from when the first signal is received to when a value obtained by the time integration reaches the half of the estimated total amount of thermal stress; and upon receipt of the first signal, the control circuit saves data stored in the ferroelectric memory to the memory, and then starts writing of the inverted data into the ferroelectric memory when the time calculated by the thermal stress calculation circuit has elapsed, while upon receipt of the second signal, the control circuit stops the writing of the inverted data into the ferroelectric memory.

In the inventive reader/writer, when the temperature of the ferroelectric memory exceeds a predetermined value, the control circuit saves the data stored in the ferroelectric memory to the memory in the reader/writer, and imprint degradation in the ferroelectric memory is allowed to proceed for the period of time corresponding to the half of the total amount of thermal stress estimated by the thermal stress calculation circuit. And the inverted data generated by the inverting circuit is written into the ferroelectric memory for the period of time corresponding to the remaining half, which allows the degraded imprint to recover substantially to its original state. Therefore, deterioration in data retention characteristics, data loss, and imprint degradation are all prevented in the ferroelectric memory.

An inventive data carrier system includes: a first memory, which is a ferroelectric memory; a second memory; a polarization canceling circuit for canceling polarization of the first memory in accordance with an instruction given thereto; and a control circuit for making data access to the first and second memories and controlling operation of the polarization canceling circuit, wherein upon receipt of a first instruction, the control circuit saves data stored in the first memory to the second memory and then gives an instruction for canceling polarization to the polarization canceling circuit, while upon receipt of a second instruction, the control circuit writes the data saved to the second memory back into the first memory.

In the inventive data carrier system, when the first instruction is given to the control circuit, the control circuit saves the data stored in the first memory (the ferroelectric memory) to the second memory, and then the polarization canceling circuit cancels the polarization of the ferroelectric memory.

When the second instruction is output to the control circuit, the control circuit writes the data saved to the second memory back into the ferroelectric memory. Therefore, where there is a risk that the data stored in the ferroelectric memory may be lost, for example, where the data carrier is treated in a high temperature treatment process or the like, the data stored in the ferroelectric memory is saved to the second memory, before the polarization of the ferroelectric memory is cancelled. And after the risk is eliminated, the data saved to the second memory is written back to the ferroelectric memory, whereby deterioration in data retention characteristics, data loss, and imprint degradation are all prevented in the ferroelectric memory.

An inventive data carrier system includes: a first memory, which is a ferroelectric memory; a second memory; a temperature sensor for measuring temperature of the first memory, outputting a first signal when the temperature exceeds a predetermined value, and outputting a second signal when the temperature falls below a predetermined value; an inverting circuit for inverting data read from the second memory to generate inverted data; and a control circuit for making data access to the first and second memories, wherein upon receipt of the first signal, the control circuit saves data stored in the first memory to the second memory and then writes the data stored in the second memory and the inverted data alternately into the first memory, while upon receipt of the second signal, the control circuit writes the data stored in the second memory into the first memory.

An inventive data carrier system includes: a first memory, which is a ferroelectric memory; a second memory; a temperature sensor for measuring temperature of the first memory, outputting a first signal when the temperature exceeds a predetermined value, and outputting a second signal when the temperature falls below a predetermined value; an inverting circuit for inverting data read from the second memory to generate inverted data; a thermal stress calculation circuit for estimating a total amount of thermal stress applied to the first memory by performing time integration of the temperature of the first memory measured by the temperature sensor for a period of time from when the thermal stress calculation circuit receives the first signal to when the thermal stress calculation circuit receives the second signal, and calculating a length of time from when the first signal is received to when a value obtained by the time integration reaches the half of the estimated total amount of thermal stress; and a control circuit for making data access to the first and second memories, wherein upon receipt of the first signal, the control circuit saves data stored in the first memory to the second memory, and then starts writing of the inverted data into the first memory when the time calculated by the thermal stress calculation circuit has elapsed, while upon receipt of the second signal, the control circuit stops the writing of the inverted data to the first memory.

An inventive method for saving and restoring data stored in a ferroelectric memory includes the steps of: (1) saving the data stored in the ferroelectric memory to a second memory, when temperature of the ferroelectric memory exceeds a predetermined value; (2) after the step (1), canceling polarization of the ferroelectric memory; and (3) after the step (2), writing the data saved to the second memory back into the ferroelectric memory, when the temperature falls below a predetermined value.

According to the inventive method, when the temperature of the ferroelectric memory exceeds a predetermined value, the data stored in the ferroelectric memory is saved to the second memory, and then the polarization of the ferroelectric memory is cancelled. And when the temperature of the ferroelectric memory falls below a predetermined value, the data saved to the second memory is written back to the ferroelectric memory. Therefore, where there is a risk that the data stored in the ferroelectric memory may be lost, for example, where the data carrier is treated in a high temperature treatment process or the like, the data stored in the ferroelectric memory is saved to the second memory, before the polarization of the ferroelectric memory is cancelled. And after the risk is eliminated, the data saved to the second memory is written back to the ferroelectric memory, whereby deterioration in data retention characteristics, data loss, and imprint degradation are all prevented in the ferroelectric memory.

DETAILED DESCRIPTION OF THE INVENTION

Figure 1:
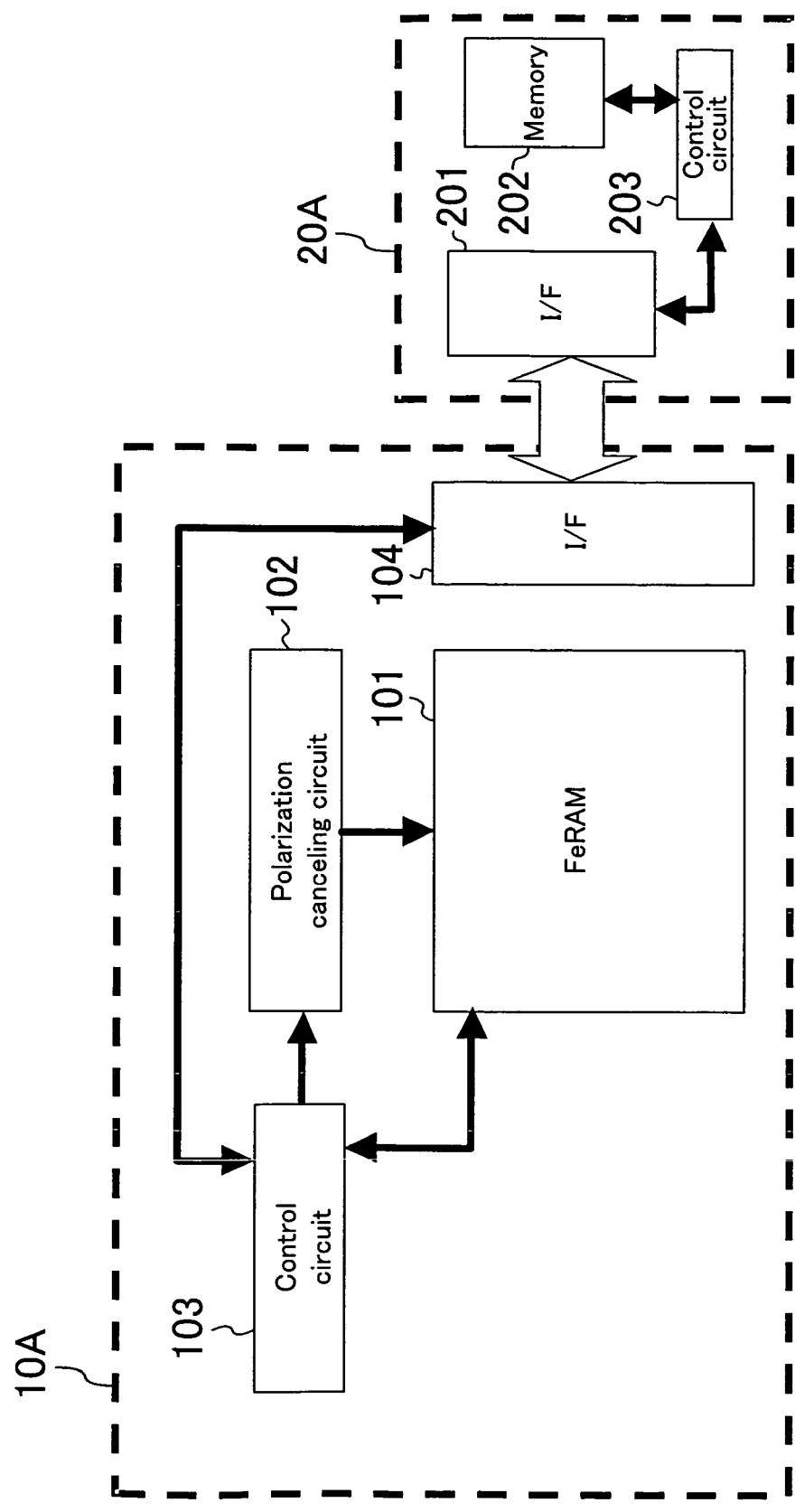
FIG. 1 illustrates the configuration of a data carrier system according to a first embodiment.

Hereinafter, preferred embodiments of the present invention will be described with reference to the accompanying drawings. In the drawings, the same components are identified by the same reference numerals and the descriptions thereof will not be repeated.

First Embodiment

FIG. 1 illustrates the configuration of a data carrier system according to a first embodiment. The data carrier system of this embodiment is composed of a data carrier 10A and a reader/writer 20A. The data carrier 10A includes a ferroelectric memory (FeRAM) 101, a polarization canceling circuit 102 for canceling polarization of the ferroelectric memory 101, a control circuit 103 for making data access to the ferroelectric memory 101 and controlling the operation of the polarization canceling circuit 102, and a communication interface (I/F) 104 for communicating with the reader/writer 20A. The reader/writer 20A includes a communication interface (I/F) 201 for communicating with the data carrier 10A, a memory 202, and a control circuit 203 for making data access to the memory 202.

The data carrier system of this embodiment operates in the following manner. Before the data carrier 10A is treated in a high temperature treatment process, the reader/writer 20A gives an instruction for canceling polarization (a polarization canceling instruction) to the data carrier 10A. Specifically, the instruction is output from the control circuit 203 and transmitted to the control circuit 103 through the interfaces 201 and 104. The control circuit 103, upon receipt of the instruction, reads data from the ferroelectric memory 101 and sends the data to the reader/writer 20A through the interface 104. In the reader/writer 20A, the control circuit 203 writes the data received via the interface 201 into the memory 202.

After the data saving described above is complete, the control circuit 103 gives the polarization canceling instruction to the polarization canceling circuit 102. At this time, the control circuit 103 forcefully permits writing into the ferroelectric memory 101. This is because the data carrier 10A, like a typical data carrier, has the function of preventing data writing when a write voltage is equal to or lower than a predetermined value, so as to ensure the safety of data in the ferroelectric memory 101. Polarization cancellation is typically performed by gradually lowering the write voltage with "1" and "0" being written alternately until the polarization state becomes neither "1" nor "0". Therefore, to cancel polarization by such a method, it is necessary to forcefully permit data writing into the ferroelectric memory 101 so as to allow the polarization cancellation.

It should be noted that in a case in which the amount of polarization is reduced by adjusting the data write time or in a case in which a voltage for canceling polarization is supplied by a step-down circuit, it is not necessary for the control circuit 103 to forcefully permit writing into the ferroelectric memory 101.

After the completion of polarization cancellation by the polarization canceling circuit 102, it becomes possible at last to subject the data carrier 10A to the high temperature treatment process. When the data carrier 10A has sufficiently cooled down after the completion of the high temperature treatment process, the reader/writer 20A gives a polarization cancellation end instruction to the data carrier 10A. To be specific, the instruction is output from the control circuit 203 and transmitted to the control circuit 103 by way of the interfaces 201 and 104. Upon receipt of the instruction, the control circuit 103 gives the polarization cancellation end instruction to the polarization canceling circuit 102. This causes the cancellation of the polarization of the ferroelectric memory 101 to end.

Thereafter, the control circuit 203 reads the data saved into the memory 202 and sends the read data to the data carrier 10A through the interface 201. In the data carrier 10A, the control circuit 103 writes the data received through the interface 104 back into the ferroelectric memory 101. When it is unnecessary to restore the data, data writing to the ferroelectric memory 101 may only be permitted without the write-back of the data.

As described above, in this embodiment, even when the temperature of the ferroelectric memory. 101 is increased almost to the Curie temperature in the high temperature treatment process, imprint degradation does not proceed because the polarization of the ferroelectric memory 101 is cancelled beforehand. Also, when the temperature is close to the Curie temperature, the retention characteristics of the ferroelectric memory 101 deteriorate, and when the temperature is further increased to exceed the Curie temperature, the stored data is lost. Nevertheless, since the data saving to the reader/writer 20A is performed in advance, the data can be restored.

Figure 2:
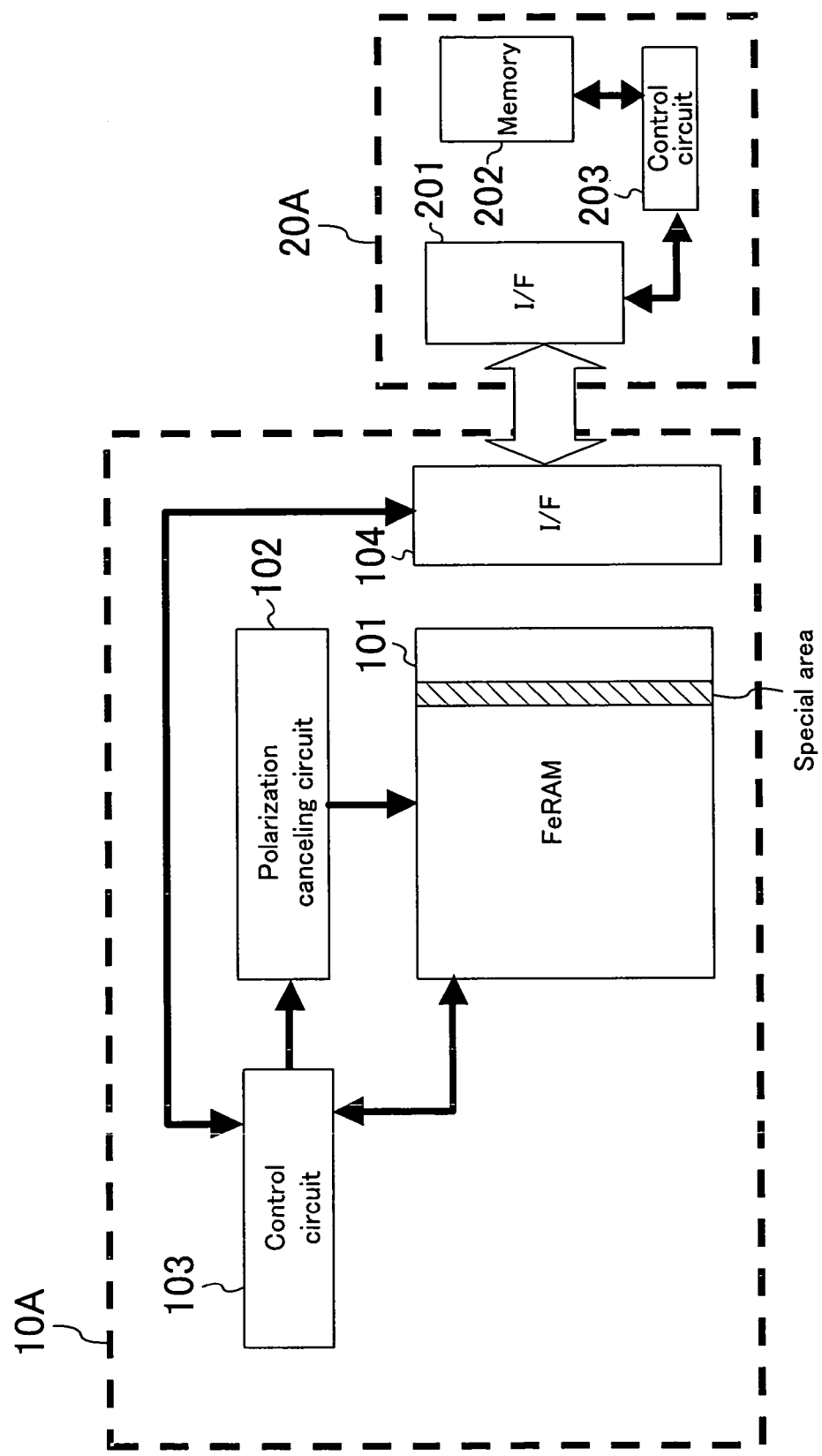
FIG. 2 illustrates the configuration of a data carrier system, in which a special area is formed in a ferroelectric memory shown in FIG. 1.

It should be noted that a special area may be formed in the ferroelectric memory 101 as shown in FIG. 2. In that case, the data carrier system may be designed so that read-only data that does not need rewriting is stored in the special area and that polarization cancellation for this special area is not performed. This allows imprint degradation to proceed only in the special area in the high temperature treatment process. That is, the ferroelectric memory 101 is partially changed to ROM. When the temperature exceeds the Curie temperature in the high temperature treatment process, the polarization of the special area is cancelled without changing the special area to ROM, thereby resulting in the loss of data stored in the special area. As described above, however, since it is possible to restore the data, this produces no problems in terms of data loss prevention.

Second Embodiment

Figure 3:
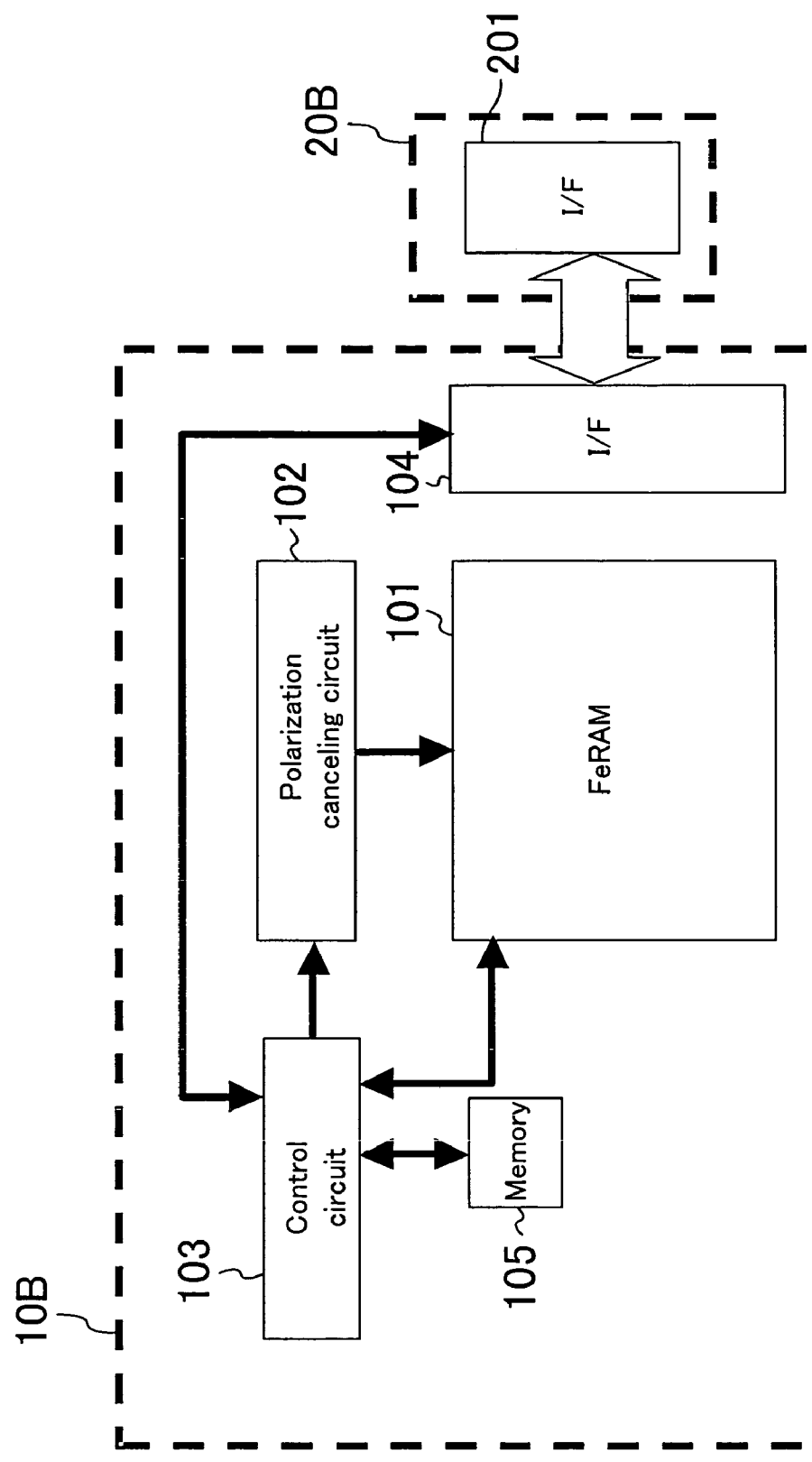
FIG. 3 illustrates the configuration of a data carrier system according to a second embodiment.

FIG. 3 illustrates the configuration of a data carrier system according to a second embodiment. The data carrier system of this embodiment is composed of a data carrier 10B and a reader/writer 20B. The data carrier 10B is obtained by adding a memory 105, which is other than a ferroelectric memory, to the data carrier 10A shown in FIG. 1. The reader/writer 20B is obtained by omitting the memory 202 and the control circuit 203 from the reader/writer 20A shown in FIG. 1.

The data carrier system of this embodiment saves data stored in a ferroelectric memory 101 to the memory 105 inside the data carrier 10B. As the memory 105, an EEPROM, a flash memory, a CMOS non-volatile memory, or the like may be used. Furthermore, if power is supplied to the data carrier 10B in high temperature treatment process, an SRAM, a register, or the like may also be used as the memory 105. Although the data retention characteristics of these types of memories deteriorate in high temperature environments, these memories can retain data for several hours at temperatures near the Curie temperature and thus sufficiently function as a memory to which the data stored in the ferroelectric memory 101 is saved. In terms of costs, it is advantageous to use a CMOS non-volatile memory. In addition, when a non-volatile memory is used, it is not necessary to supply power in high temperature treatment process, thereby allowing reduction in power consumption.

The data carrier system of this embodiment operates in the following manner. Before the data carrier 10B is treated in a high temperature treatment process, the reader/writer 20B gives a polarization canceling instruction to the data carrier 10B. The instruction is transmitted to a control circuit 103 through an interface 104. Upon receipt of the instruction, the control circuit 103 reads data from the ferroelectric memory 101 and writes the read data into the memory 105.

After the completion of the above-described data saving, the control circuit 103 gives the polarization canceling instruction to a polarization canceling circuit 102. When the polarization cancellation by the polarization canceling circuit 102 is complete, it becomes possible at last to subject the data carrier 10B to the high temperature treatment process.

When the data carrier 10B has sufficiently cooled down after the completion of the high temperature treatment process, the reader/writer 20B sends a polarization cancellation end instruction to the data carrier 10B. The instruction is transmitted to the control circuit 103 via the interface 104. Upon receipt of the instruction, the control circuit 103 reads the data from the memory 105 and writes the read data back to the ferroelectric memory 101. The reason why the data is written back into the ferroelectric memory 101 is because the ferroelectric memory 101 has more excellent tamper-resistant characteristics than the memory 105 and it is thus preferable to store the data in the ferroelectric memory 101 in terms of ensuring the data storage. When it is unnecessary to restore the data, data writing into the ferroelectric memory 101 may only be permitted without the write-back of the data.

As described above, where the data stored in the ferroelectric memory 101 is saved to the memory 105 inside the data carrier 10B as in this embodiment, the same effects as those of the first embodiment are also achievable.

Third Embodiment

Figure 4:
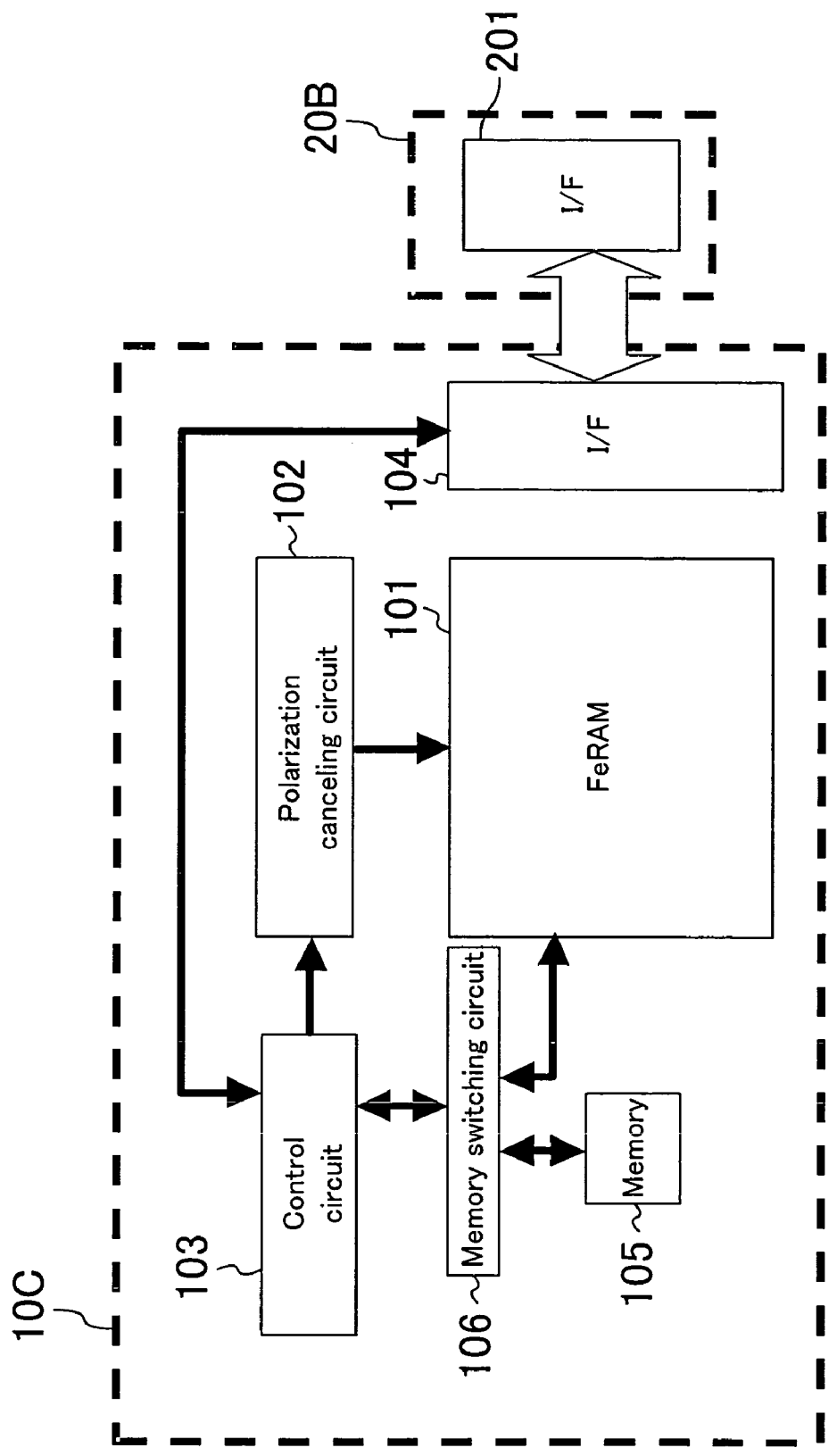
FIG. 4 illustrates the configuration of a data carrier system according to a third embodiment.

FIG. 4 illustrates the configuration of a data carrier system according to a third embodiment. The data carrier system of this embodiment is composed of a data carrier 10C and a reader/writer 20B. The data carrier 10C is obtained by adding a memory switching circuit 106 to the data carrier 10B shown in FIG. 3. The reader/writer 20B is the same as that shown in FIG. 3.

The memory switching circuit 106 switches between a ferroelectric memory 101 and a memory 105 as the main memory in the data carrier 10C. That is, data access is made to either the ferroelectric memory 101 or the memory 105 selected by the memory switching circuit 106.

Specifically, the memory switching circuit 106 selects the ferroelectric memory 101 as the main memory before polarization of the ferroelectric memory 101 is cancelled, and switches to the memory 105 after the polarization cancellation. Therefore, when data communications with the reader/writer 20B are carried out in a high temperature treatment process, the reading and writing of data from and into the memory 105 are performed. When the reader/writer 20B outputs a polarization cancellation end instruction, the memory switching circuit 106 selects the ferroelectric memory 101 as the main memory.

As described above, in this embodiment, data access to the data carrier 10C is possible even in a high temperature treatment process. Therefore, if it is assumed that the data carrier 10c is used as an IC tag for a FA process control or the like, for example, data collection or the like from the IC tag can be performed even in a high temperature treatment process.

Fourth Embodiment

Figure 5:
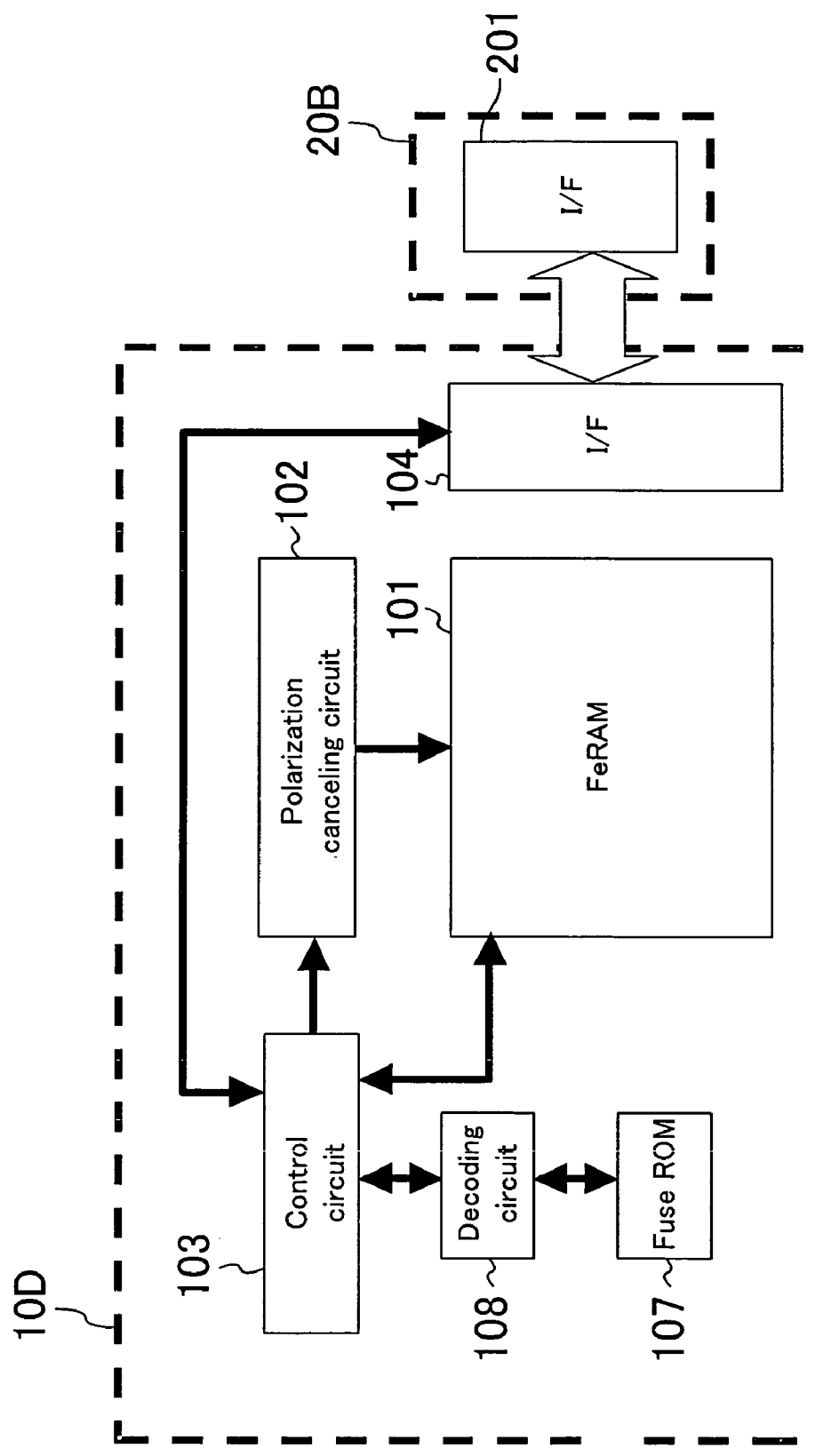
FIG. 5 illustrates the configuration of a data carrier system according to a fourth embodiment.

FIG. 5 illustrates the configuration of a data carrier system according to a fourth embodiment. The data carrier system of this embodiment is composed of a data carrier 10D and a reader/writer 20B. The data carrier 10D includes a fuse ROM 107 in place of the memory 105 shown in FIG. 3 and also includes a decoding circuit 108. The reader/writer 20B is the same as that shown in FIG. 3.

A ferroelectric memory 101 has excellent tamper-resistant characteristics but has the drawback of being heat-sensitive. Therefore, data that should not be lost or overwritten (such as data for correcting variable fabrication characteristics, memory redundant data, various types of ID information, and inspection history) is stored in the ferroelectric memory 101, while the data is also stored beforehand in the fuse ROM 107 at the time of the fabrication of the data carrier 10D, for example. Furthermore, such data, which is often relatively highly confidential, is encoded before it is stored in the fuse ROM 107.

Upon receipt of a polarization cancellation end instruction from the reader/writer 20B, a control circuit 103 reads the data stored in the fuse ROM 107 and writes the read data into the ferroelectric memory 101. At this time, the decoding circuit 108 decodes the encoded data stored in the fuse ROM 107.

As described above, according to this embodiment, even if the data stored in the ferroelectric memory 101 is lost in a high temperature treatment process, it is possible to restore the highly important data stored in the fuse ROM 107.

It should be noted that the tamper-resistant characteristics are improved by supplying a decoding key from the reader/writer 20B. Also, where encoding is not necessary, the decoding circuit 108 may be omitted.

Fifth Embodiment

Figure 6:
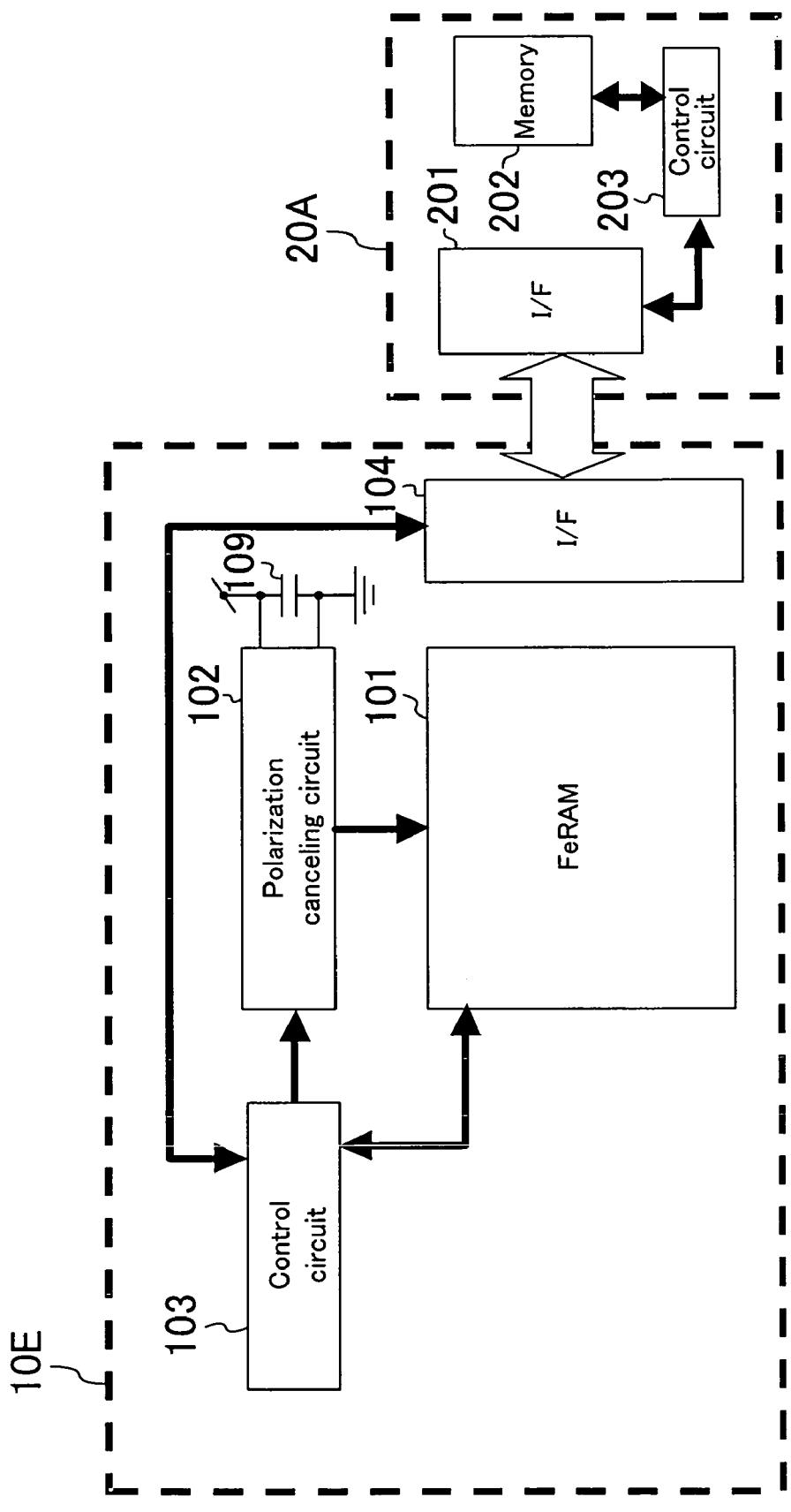
FIG. 6 illustrates the configuration of a data carrier system according to a fifth embodiment.

FIG. 6 illustrates the configuration of a data carrier system according to a fifth embodiment. The data carrier system of this embodiment is composed of a data carrier 10E and a reader/writer 20A. The data carrier 10E is obtained by adding a capacitor 109 to the data carrier 10A shown in FIG. 1. The reader/writer 20A is the same as that shown in FIG. 1.

The capacitor 109 is interposed between a power node and a ground node of the data carrier 10E and charged with the power supply voltage of the data carrier 10E. A polarization canceling circuit 102 operates with discharge voltage of the capacitor 109. That is, the polarization canceling circuit 102 uses a voltage drop resulting from the discharge of the capacitor 109 so as to cancel the polarization of the ferroelectric memory 101. This enables the cancellation of the polarization of the ferroelectric memory 101 to be performed without power supply from the reader/writer 20A.

As described above, according to this embodiment, power consumption during the polarization cancellation is reduced, thereby realizing a data carrier system that consumes less power.

Sixth Embodiment

Figure 7:
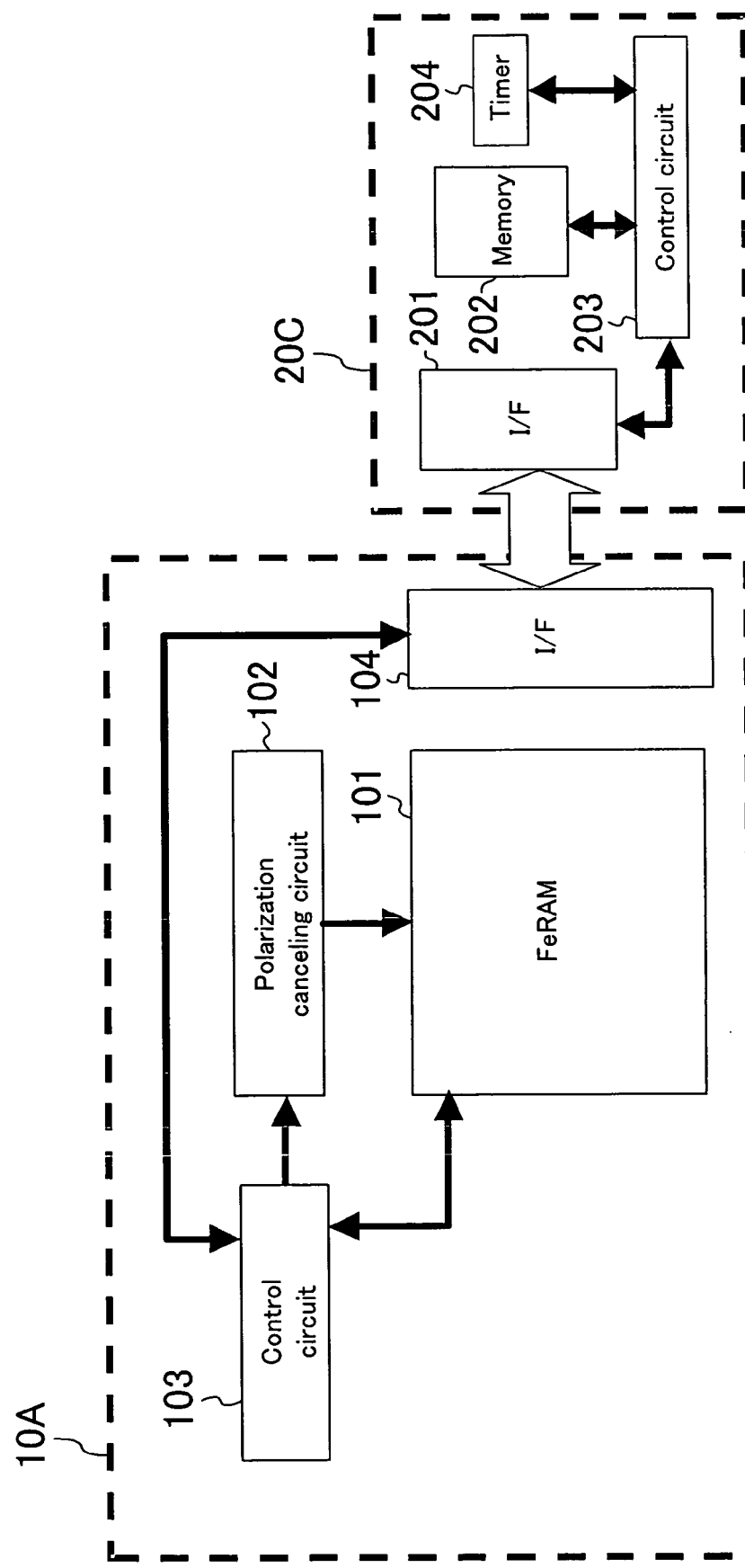
FIG. 7 illustrates the configuration of a data carrier system according to a sixth embodiment.

FIG. 7 illustrates the configuration of a data carrier system according to a sixth embodiment. The data carrier system of this embodiment is composed of a data carrier 10A and a reader/writer 20C. The reader/writer 20C is obtained by adding a timer 204 to the reader/writer 20A shown in FIG. 1. The data carrier 10A is the same as that shown in FIG. 1.

The timer 204 counts the time required for the data carrier 10A to sufficiently cool down and thus be ready for data write after the completion of a high temperature treatment process. To set the time in the timer 204, a sample data carrier may be used to measure the time required for the sample data carrier to sufficiently cool down after the completion of a high temperature treatment process, and the obtained result may be used, for example.

Once the time has been set in the timer 204, the timer 204 begins counting the time starting from the moment at which the high temperature treatment process for the data carrier 10A is complete. When the set time has elapsed, the timer 204 outputs a signal to a control circuit 203. The control circuit 203 receives the signal from the timer 204 after the completion of the high temperature treatment process for the data carrier 10A and then begins controlling the restoration of data for the data carrier 10A.

As described above, in this embodiment, the data restoration is performed at an appropriate time after the completion of the high temperature treatment process for the data carrier 10A. Therefore, imprint degradation caused by data writing performed when the temperature of the ferroelectric memory 101 is high is not likely to occur.

Seventh Embodiment

Figure 8:
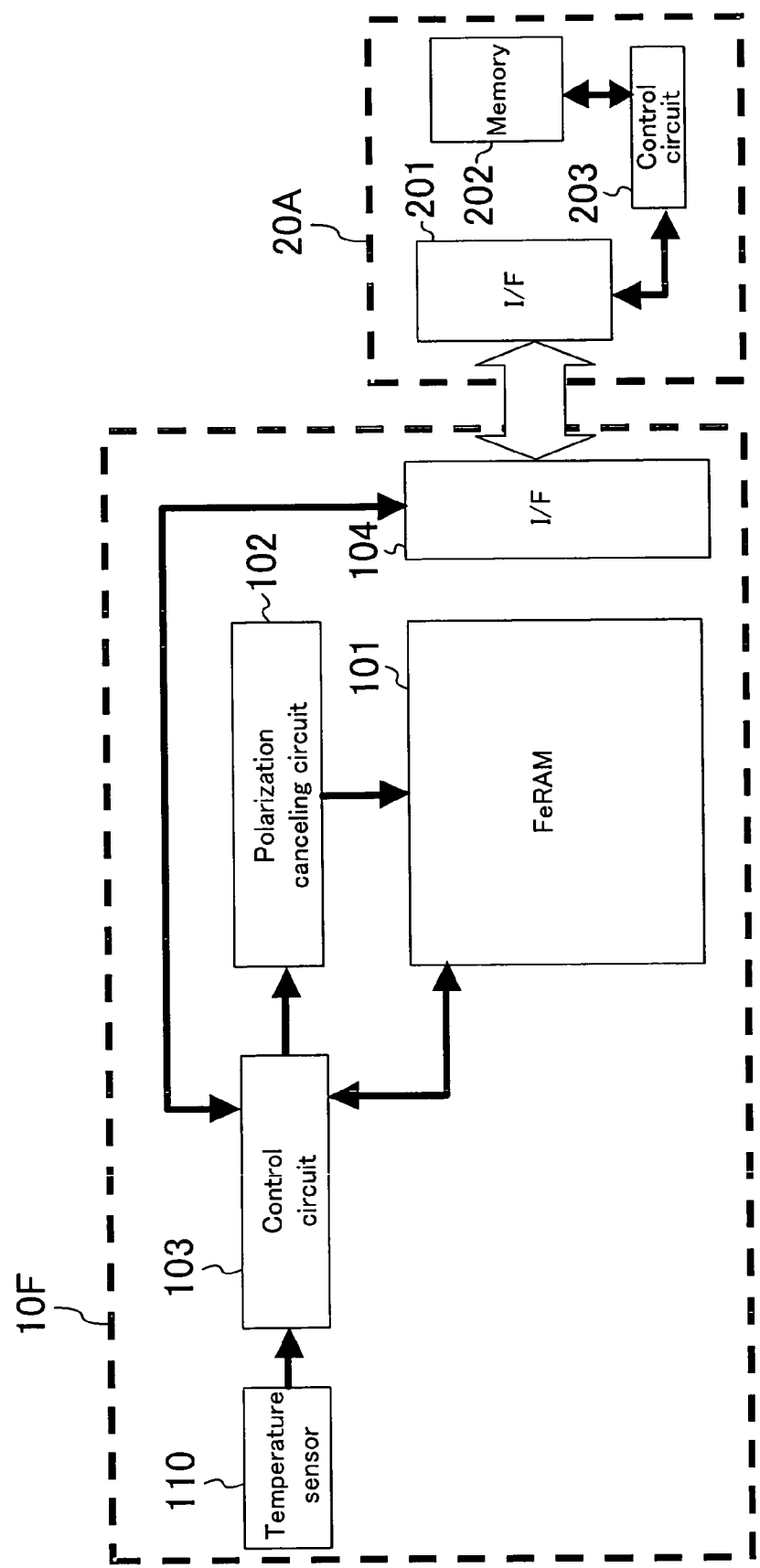
FIG. 8 illustrates the configuration of a data carrier system according to a seventh embodiment.

FIG. 8 illustrates the configuration of a data carrier system according to a seventh embodiment. The data carrier system of this embodiment is composed of a data carrier 10F and a reader/writer 20A. The data carrier 10F is obtained by adding a temperature sensor 110 to the data carrier 10A shown in FIG. 1. The reader/writer 20A is the same as that shown in FIG. 1.

The temperature sensor 110 detects the temperature of a ferroelectric memory 101 and informs a control circuit 103 of the detection result. More specifically, when the temperature of the ferroelectric memory 101 exceeds a predetermined value, the temperature sensor 110 outputs a polarization canceling instruction to the control circuit 103. On the other hand, when the temperature of the ferroelectric memory 101 falls below a predetermined value, the temperature sensor 110 outputs a polarization cancellation end instruction to the control circuit 103. It should be noted that the predetermined value of the temperature according to which the polarization canceling instruction is output may be the same as, or different from, the predetermined value of the temperature according to which the polarization cancellation end instruction is output.

As described above, in this embodiment, data saving, polarization cancellation, and data restoration for the ferroelectric memory 101 are performed automatically in accordance with the result of the detection of temperature of the ferroelectric memory 101, without an instruction from the reader/writer 20A.

Eight Embodiment

Figure 9:
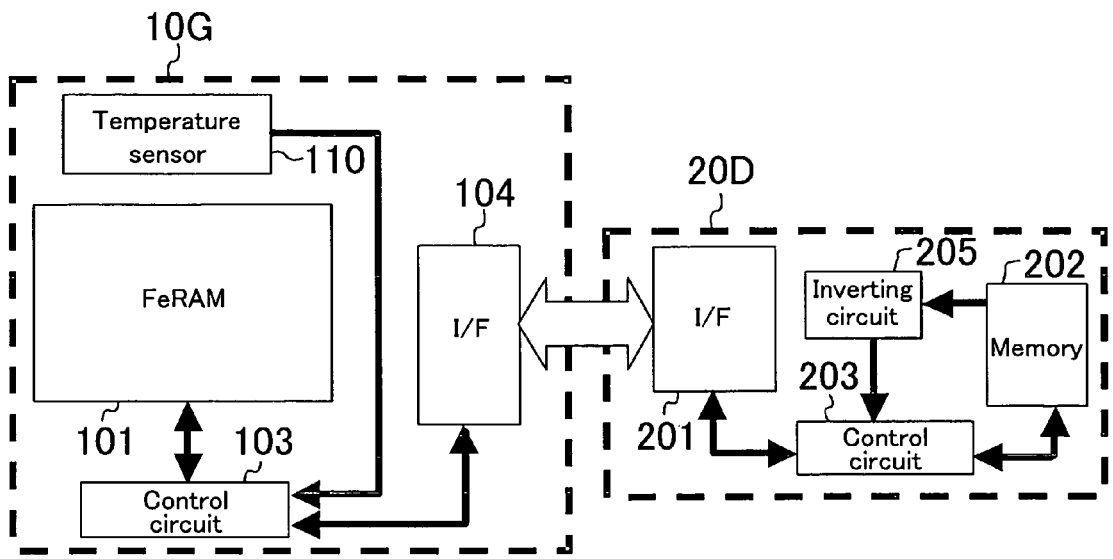
FIG. 9 illustrates the configuration of a data carrier system according to an eighth embodiment.

FIG. 9 illustrates the configuration of a data carrier system according to an eighth embodiment. The data carrier system of this embodiment is composed of a data carrier 10G and a reader/writer 20D. The data carrier 10G includes a ferroelectric memory (FeRAM) 101, a control circuit 103 for making data access to the ferroelectric memory 101, and a communication interface 104 (I/F) for communicating with the reader/writer 20D. The reader/writer 20D includes a communication interface (I/F) 201 for communicating with the data carrier 10G, a memory 202, a control circuit 203 for making data access to the memory 202, and an inverting circuit 205 for inverting data read from the memory 202.

The data carrier system of this embodiment operates in the following manner. When the temperature of the ferroelectric memory 101 exceeds a predetermined value, a temperature sensor 110 outputs an imprint recovery start instruction to the control circuit 103. Upon receipt of the instruction, the control circuit 103 saves data stored in the ferroelectric memory 101 to the reader/writer 20D. More specifically, in the reader/writer 20D, the control circuit 203 writes the data received through the interface 201 into the memory 202.

When the data saving described above is complete, the control circuit 203 transmits the data read from the memory 202 and the inverse data thereof inverted by the inverting circuit 205 alternately to the data carrier 10G. In the data carrier 10G, the control circuit 103 writes the data received through the interface 104 into the ferroelectric memory 101. This write operation may be repeated at certain intervals.

When the temperature of the ferroelectric memory 101 falls below a predetermined value, the temperature sensor 110 outputs an imprint recovery end instruction to the control circuit 103. Upon receiving the instruction, the control circuit 103 writes the data saved to the reader/writer 20D into the ferroelectric memory 101 and then terminates the processing described above.

As mentioned above, in this embodiment, the inverse and non-inverse of the saved data are alternately written into the ferroelectric memory 101 while the ferroelectric memory 101 is subjected to thermal stress, thereby preventing imprint degradation from proceeding.

Ninth Embodiment

Figure 10:
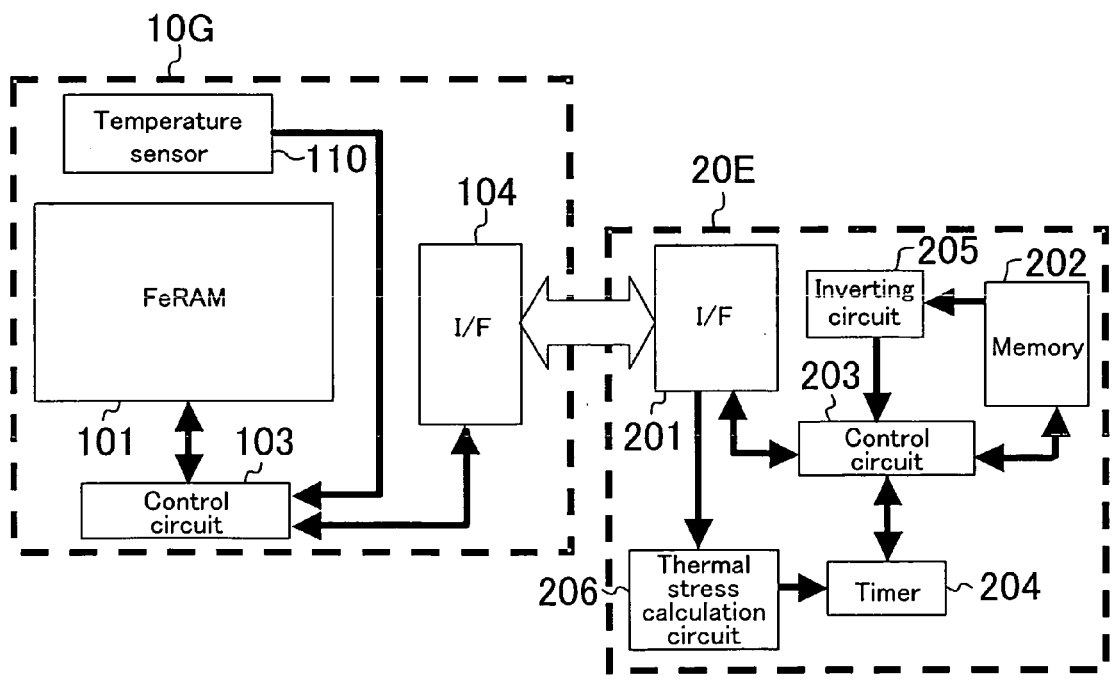
FIG. 10 illustrates the configuration of a data carrier system according to a ninth embodiment.

FIG. 10 illustrates the configuration of a data carrier system according to a ninth embodiment. The data carrier system of this embodiment is composed of a data carrier 10G and a reader/writer 20E. The reader/writer 20E is obtained by adding a timer 204 and a thermal stress calculation circuit 206 to the reader/writer 20D shown in FIG. 9. The data carrier 10G is the same as that shown in FIG. 9.

The thermal stress calculation circuit 206 estimates the total amount of thermal stress applied to a ferroelectric memory 101, and calculates the length of time from when the application of thermal stress exceeding a predetermined temperature to the ferroelectric memory 101 is started to when the amount of thermal stress reaches the half of the estimated total amount of thermal stress.

More specifically, when the temperature of the ferroelectric memory 101 exceeds the predetermined value in a high temperature treatment process or the like, the temperature sensor 110 detects that and outputs a signal (an imprint recovery start instruction). The signal is transmitted to the thermal stress calculation circuit 206 through interfaces 104 and 201. Upon receipt of the signal, the thermal stress calculation circuit 206 starts the time integration of the temperature of the ferroelectric memory 101. When the temperature of the ferroelectric memory 101 falls below a predetermined value, the temperature sensor 110 detects that and outputs a signal (an imprint recovery end instruction). The signal is transmitted to the thermal stress calculation circuit 206 through the interfaces 104 and 201. Upon receipt of the signal, the thermal stress calculation circuit 206 terminates the time integration. The value of the time integral obtained at this time is the total amount of thermal stress applied to the ferroelectric memory 101. And the thermal stress calculation circuit 206 calculates the length of time from when the imprint recovery start instruction is output to when the amount of thermal stress applied to the ferroelectric memory 101 reaches the half of the estimated total amount of thermal stress.

The timer 204 counts the time from the output of the imprint recovery start instruction to the end of the time calculated by the thermal stress calculation circuit 206, and also counts the time from the output of the imprint recovery start instruction to the output of the imprint recovery end instruction.

In the estimation of the total amount of thermal stress and the calculation of the time by the thermal stress calculation circuit 206 and in the setting of the time in the timer 204, a sample data carrier may be used to measure the time required for the sample data carrier to sufficiently cool down after the completion of a high temperature treatment process, and the obtained result may be used, for example.

The data carrier system of this embodiment operates in the following manner. In the data carrier 10G, when the temperature of the ferroelectric memory 101 exceeds a predetermined value, the temperature sensor 110 detects that and outputs an imprint recovery start instruction. Upon receipt of the instruction, the control circuit 103 saves data stored in the ferroelectric memory 101 to the reader/writer 20E. In the reader/writer 20E, the data transmitted from the data carrier 10G is written into a memory 202, while the timer 204 starts counting the set time.

And when the period of time from when the imprint recovery start instruction is output to when the amount of thermal stress reaches the half has elapsed, the timer 204 outputs a signal to the control circuit 203. The control circuit 203 does not write data into the data carrier 10G until the control circuit 203 receives the signal. And upon receipt of the signal, the control circuit 203 starts writing of the inverted data output from the inverting circuit 205. Thereafter, a signal is output from the timer 204 almost simultaneously with the output of an imprint recovery end instruction. Upon receipt of the signal, the control circuit 203 stops the writing of the inverted data.

As described above, in this embodiment, imprint degradation is allowed to proceed in the ferroelectric memory 101 for the period of time corresponding to the half of the total amount of thermal stress applied to the ferroelectric memory 101 in a high temperature treatment process or the like, and the inverted data is written into the ferroelectric memory 101, i.e., an electric field in the opposite direction is applied, for the period of time corresponding to the remaining half. This allows the imprint degraded in the early stage of the high temperature treatment process to recover substantially to its original state, when the process is complete.

Also, this embodiment, in which only one data write operation is required to allow the degraded imprint to recover, is more advantageous than the eighth embodiment in terms of power consumption and the ferroelectric memory's life.

Tenth Embodiment

Figure 11:
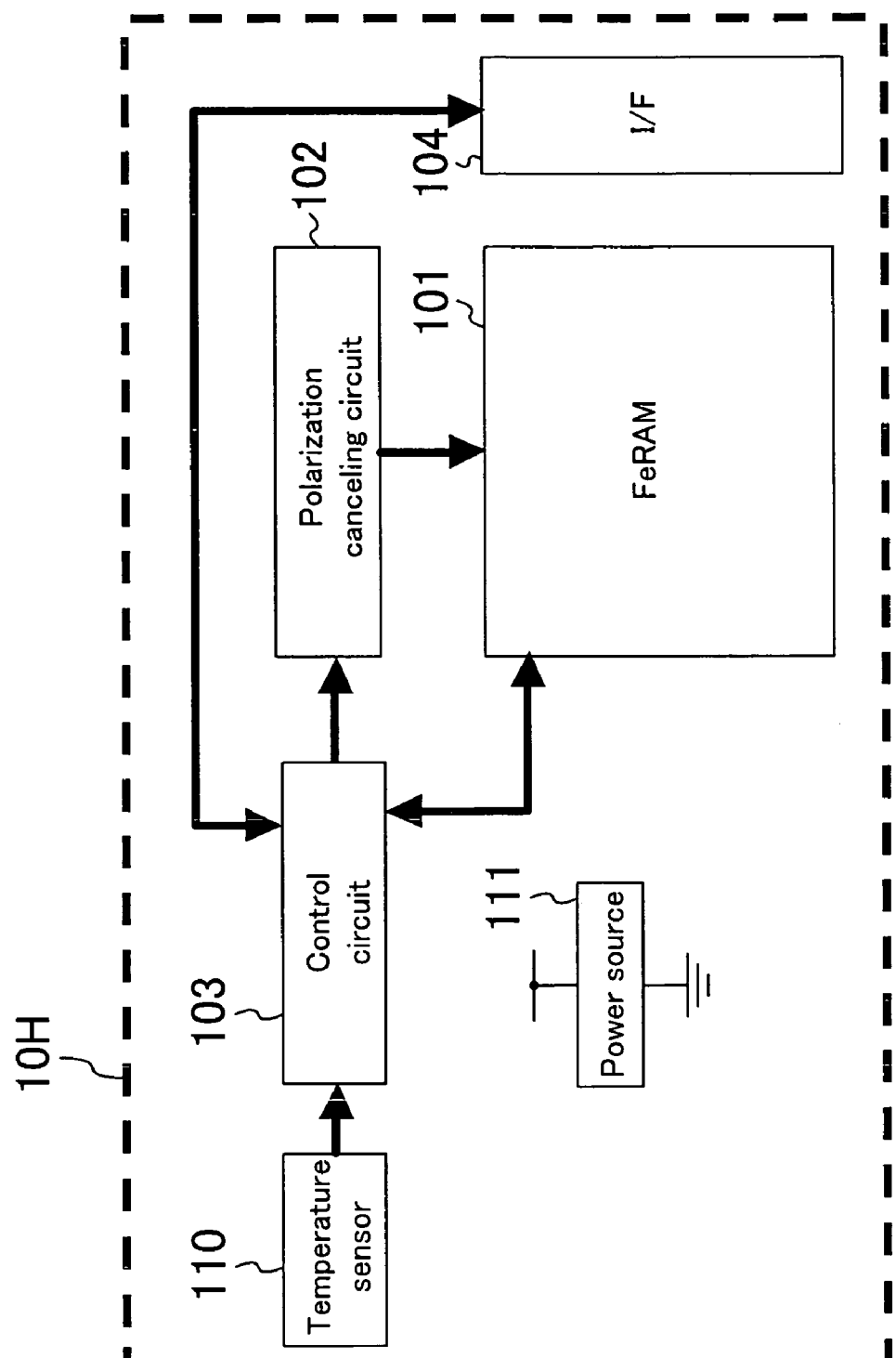
FIG. 11 illustrates the configuration of a data carrier according to a tenth embodiment.

FIG. 11 illustrates the configuration of a data carrier according to a tenth embodiment. The data carrier 10H of this embodiment is obtained by adding a power source 111 to the data carrier 10F shown in FIG. 8.

The power source 111 supplies operating power of the data carrier 10H. As the power source 111, a battery, an inductor for external non-contact power supply, and the like may be used.

As described above, in this embodiment, data saving, polarization cancellation, and data restoration for a ferroelectric memory 101 are performed by the data carrier alone. Therefore, the data carrier according to this embodiment is suitably applicable to storage in a high temperature warehouse and the like.

By equipping the data carriers according to the first to seventh embodiments with a memory for data saving, a polarization canceling circuit, a temperature sensor, a power source, and the like, it is possible to make those data carriers capable of automatically performing data saving, polarization cancellation, and data restoration by themselves. Also, by equipping the data carriers 10G according to the eighth and ninth embodiments with the memory 202, the timer 204, the inverting circuit 205, and the thermal stress calculation circuit 206 provided in the reader/writers 20D and 20E, respectively, it is possible to make those data carriers capable of automatically suppressing imprint degradation from proceeding by themselves.

Eleventh Embodiment

Figure 12:
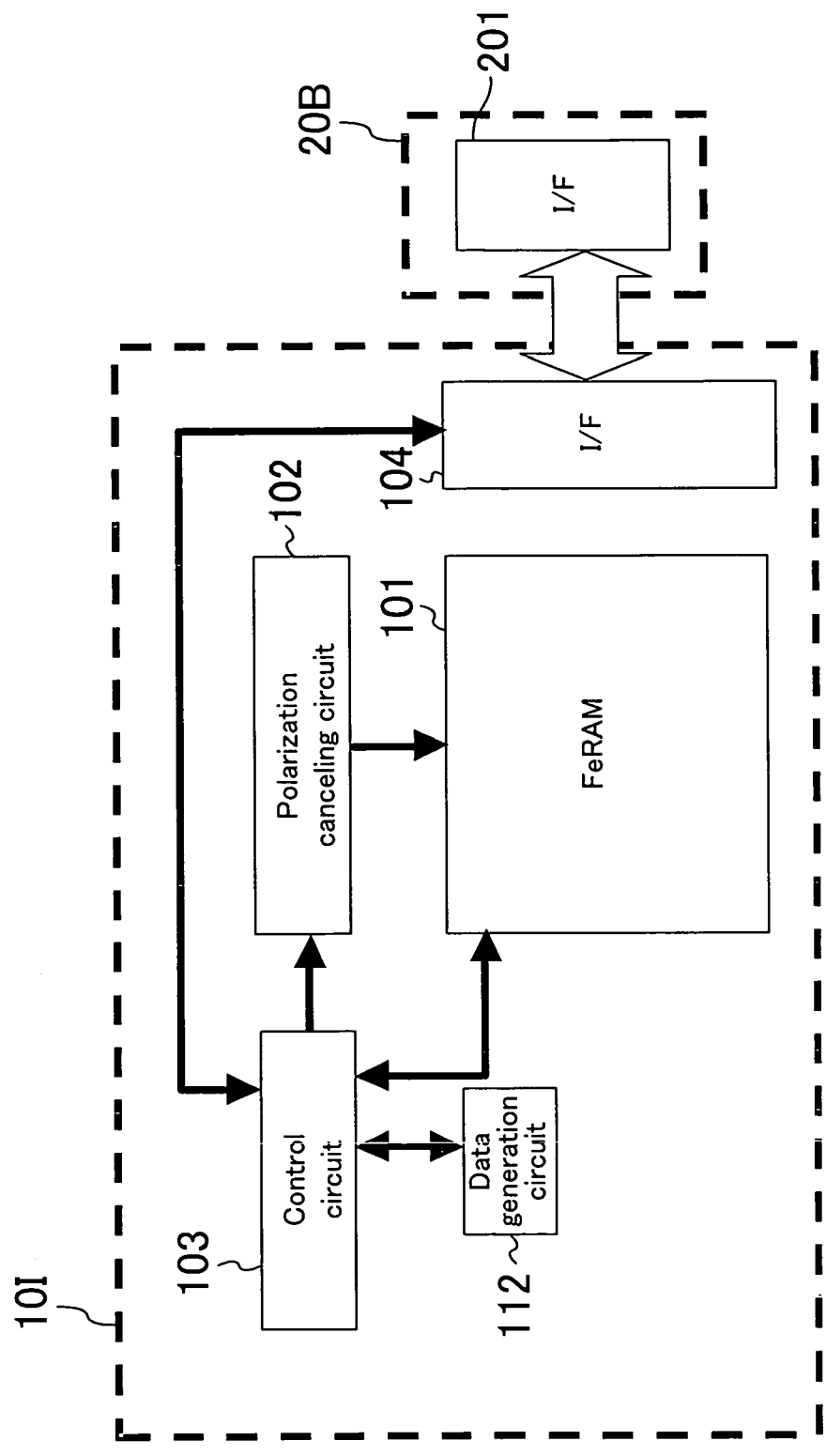
FIG. 12 illustrates the configuration of a data carrier system according to an eleventh embodiment.

FIG. 12 illustrates the configuration of a data carrier system according to an eleventh embodiment. The data carrier system of this embodiment is composed of a data carrier 10I and a reader/writer 20B. The data carrier 10I includes a data generation circuit 112 in place of the memory 105 shown in FIG. 3. The reader/writer 20B is the same as that shown in FIG. 3.

The amount of data of a predetermined value in the initial state out the door, such as various types of ID information and inspection history, corresponds to only several words. Thus, to restore only such a small amount data, it is advantageous to provide a circuit for generating new data, without providing the memory 105 for data saving shown in FIG. 3. The data generation circuit 112 generates the above-described predetermined value in the initial state out the door, for example, predetermined data, such as various types of ID information and inspection history.

More specifically, after receiving a polarization cancellation end instruction from the reader/writer 20B, a control circuit 103 gives an instruction for generating data (a data generation instruction) to the data generation circuit 112. Upon receipt of the instruction, the data generation circuit 112 generates predetermined data. And the control circuit 103 writes the predetermined data generated by the data generation circuit 112 into a ferroelectric memory 101.

As described above, in this embodiment, even if data stored in the ferroelectric memory 101 is lost in a high temperature treatment process, the predetermined value in the initial state out the door can be easily restored without particularly including a memory for data saving.

Twelfth Embodiment

Figure 13:
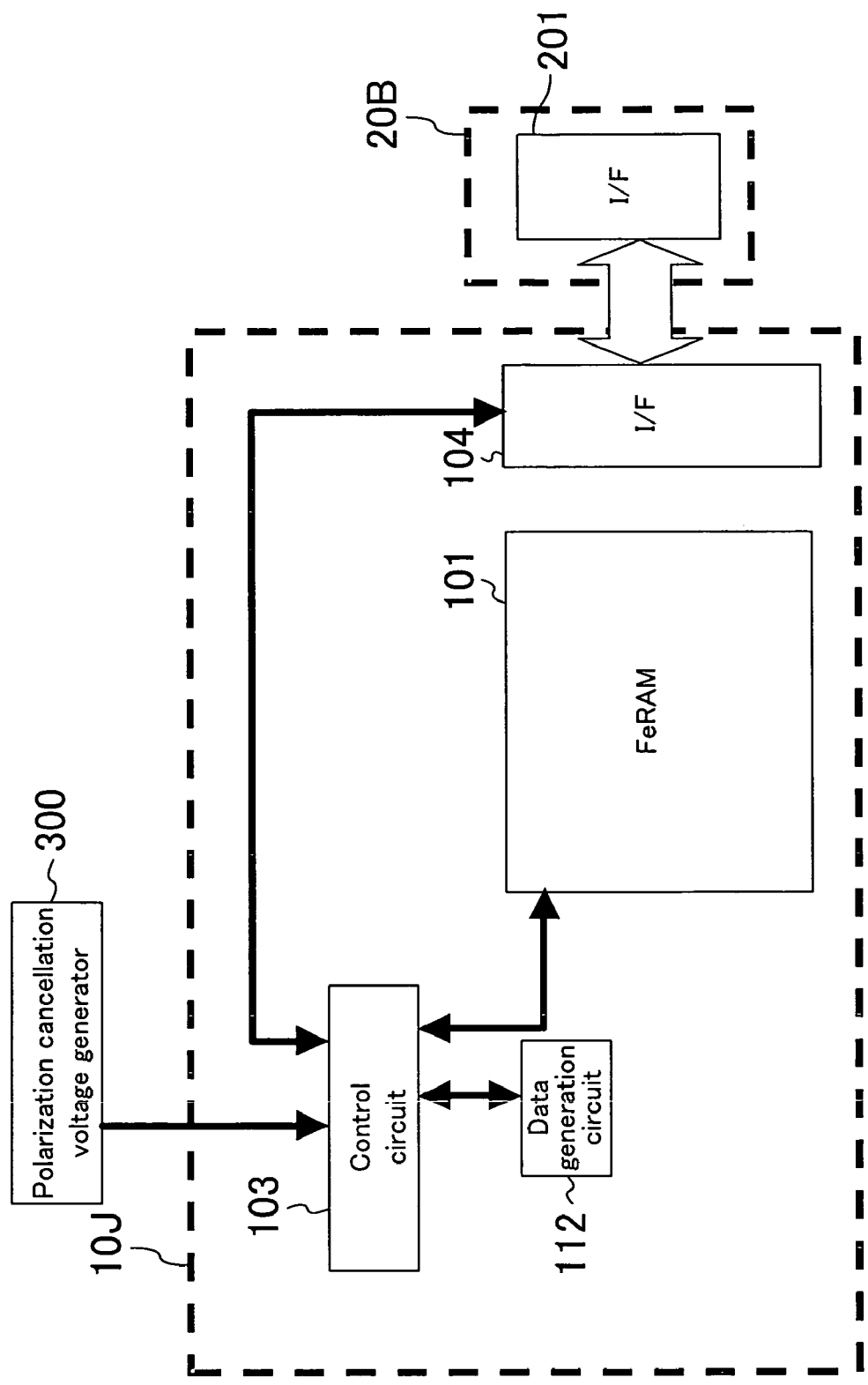
FIG. 13 illustrates the configuration of a data carrier system according to a twelfth embodiment.

FIG. 13 illustrates the configuration of a data carrier system according to a twelfth embodiment. The data carrier system of this embodiment is composed of a data carrier 10J and a reader/writer 20B. The data carrier 10J is obtained by omitting the polarization canceling circuit 102 from the data carrier 10I shown in FIG. 12. The reader/writer 20B is the same as that shown in FIG. 3.

The data carrier 10J is supplied with a voltage for canceling the polarization of a ferroelectric memory 101 from an external polarization cancellation voltage generator 300. A control circuit 103 has the function of controlling writing of data "1" into the ferroelectric memory 101 by using the voltage supplied from the polarization cancellation voltage generator 300.

More specifically, upon receiving a polarization canceling instruction from the reader/writer 20B, the control circuit 103 writes data "1" into the ferroelectric memory 101 by using the voltage supplied from the polarization cancellation voltage generator 300.

According to this embodiment, the circuit configuration of the data carrier is very simplified.

It should be noted that the polarization cancellation voltage generator 300 may be provided in the reader/writer 20B. Furthermore, an inspection device or a tester for the data carrier may be used as the polarization cancellation voltage generator 300. In the case where a tester or the like is used, data may be directly written into the ferroelectric memory 101 by bypassing the control circuit 103. By using an existing inspection device, tester, or the like that manufacturers already have as the polarization cancellation voltage generator 300, it is possible to realize a system having the same function as that of the data carrier system shown in FIG. 12 at lower costs in an easier way.

It should be also noted that the polarization canceling circuit 102 may be omitted from the data carriers of the first to seventh embodiments and that these data carriers may receive a voltage for polarization cancellation externally.

Moreover, it is possible to avoid imprint degradation occurring due to aging by providing the data carriers according to the foregoing embodiments with the function of carrying out polarization cancellation operation or imprint degradation suppression operation for the ferroelectric memory at regular time intervals. Furthermore, in cases where it is known in advance that the temperature will exceed the Curie temperature in a high temperature treatment process, polarization cancellation operation or imprint degradation recovery operation may be omitted.

The data carrier systems according to the present invention have excellent data retention characteristics in high temperature environments and are thus particularly effective in applications including high temperature process.

What is claimed is:

1. A data carrier comprising:
a ferroelectric memory,
a polarization canceling circuit for canceling polarization of the ferroelectric memory except for polarization of a special area formed in the ferroelectric memory in accordance with an instruction given thereto, and
a control circuit for making data access to the ferroelectric memory and controlling operation of the polarization canceling circuit,
wherein upon receipt of a first instruction, the control circuit saves data stored in the ferroelectric memory to a second memory and then gives an instruction for canceling polarization to the polarization canceling circuit, while upon receipt of a second instruction, the control circuit writes the data saved to the second memory back into the ferroelectric memory.

2. A data carrier comprising:
a ferroelectric memory,
a polarization canceling circuit for canceling polarization of the ferroelectric memory in accordance with an instruction given thereto,
a control circuit for making data access to the ferroelectric memory and controlling operation of the polarization canceling circuit, and
a memory switching circuit for switching between the ferroelectric memory and a second memory which is other than a ferroelectric memory as a memory for dealing with external data access,
wherein upon receipt of a first instruction, the control circuit saves data stored in the ferroelectric memory to the second memory and then gives an instruction for canceling polarization to the polarization canceling circuit, while upon receipt of a second instruction, the control circuit writes the data saved to the second memory back into the ferroelectric memory.

3. A data carrier comprising:
a ferroelectric memory,
a polarization canceling circuit for canceling polarization of the ferroelectric memory in accordance with an instruction given thereto, and
a control circuit for making data access to the ferroelectric memory and controlling operation of the polarization canceling circuit, and
a fuse ROM,
wherein upon receipt of a first instruction, the control circuit saves data stored in the ferroelectric memory to a second memory and then gives an instruction for canceling polarization to the polarization canceling circuit, while upon receipt of a second instruction, the control circuit writes the data saved to the second memory back into the ferroelectric memory and the control circuit writes data stored in the fuse ROM into the ferroelectric memory.

4. The data carrier of claim 3, wherein the fuse ROM stores encoded data;
the data carrier includes a decoding circuit for decoding the encoded data; and
upon receipt of the second instruction, the control circuit writes data decoded by the decoding circuit into the ferroelectric memory.

5. A data carrier comprising:
a ferroelectric memory,
a capacitor which is charged with power supply voltage of the data carrier,
a polarization canceling circuit operated with discharge voltage of the capacitor for canceling polarization of the ferroelectric memory in accordance with an instruction given thereto, and
a control circuit for making data access to the ferroelectric memory and controlling operation of the polarization canceling circuit,
wherein upon receipt of a first instruction, the control circuit saves data stored in the ferroelectric memory to a second memory and then gives an instruction for canceling polarization to the polarization canceling circuit, while upon receipt of a second instruction, the control circuit writes the data saved to the second memory back into the ferroelectric memory.

6. A data carrier comprising:
a ferroelectric memory,
a polarization canceling circuit for canceling polarization of the ferroelectric memory in accordance with an instruction given thereto,
a control circuit for making data access to the ferroelectric memory and controlling operation of the polarization canceling circuit, and
a temperature sensor for measuring temperature of the ferroelectric memory, outputting a first instruction when the temperature exceeds a predetermined value, and outputting a second instruction when the temperature falls below a predetermined value,
wherein upon receipt of the first instruction, the control circuit saves data stored in the ferroelectric memory to a second memory and then gives an instruction for canceling polarization to the polarization canceling circuit, while upon receipt of the second instruction, the control circuit writes the data saved to the second memory back into the ferroelectric memory.

7. The data carrier of claim 6, comprising a power source for supplying operating power for the data carrier.

8. A data carrier comprising:
a ferroelectric memory;
a polarization canceling circuit for canceling polarization of the ferroelectric memory in accordance with an instruction given thereto;
a data generation circuit for generating predetermined data in accordance with an instruction given thereto; and
a control circuit for making data access to the ferroelectric memory and controlling operation of the polarization canceling circuit and operation of the data generation circuit,
wherein upon receipt of a first instruction, the control circuit gives an instruction for canceling polarization to the polarization canceling circuit, while upon receipt of a second instruction, the control circuit gives an instruction for generating data to the data generation circuit and writes the predetermined data generated by the data generation circuit into the ferroelectric memory.

9. A data carrier comprising:
a ferroelectric memory;
a data generation circuit for generating predetermined data in accordance with an instruction given thereto; and a control circuit for controlling access to the ferroelectric memory, operation of the data generation circuit, and cancellation of polarization of the ferroelectric memory, wherein upon receipt of a first instruction, the control circuit cancels the polarization of the ferroelectric memory by using an externally supplied voltage, while upon receipt of a second instruction, the control circuit gives an instruction for generating data to the data generation circuit and writes the predetermined data generated by the data generation circuit into the ferroelectric memory.

10. A reader/writer for a data carrier including a ferroelectric memory, wherein the data carrier includes a temperature sensor for measuring temperature of the ferroelectric memory, outputting a first signal when the temperature exceeds a predetermined value, and outputting a second signal when the temperature falls below a predetermined value;

the reader/writer includes:

a memory, a control circuit for controlling access to the memory, and an inverting circuit for inverting data read from the memory to generate inverted data; and upon receipt of the first signal, the control circuit saves data stored in the ferroelectric memory to the memory and then writes the data stored in the memory and the inverted data alternately into the ferroelectric memory, while upon receipt of the second signal, the control circuit writes the data stored in the memory into the ferroelectric memory.

11. A reader/writer for a data carrier including a ferroelectric memory, wherein the data carrier includes a temperature sensor for measuring temperature of the ferroelectric memory, outputting a first signal when the temperature exceeds a predetermined value, and outputting a second signal when the temperature falls below a predetermined value;

the reader/writer includes:

a memory, a control circuit for controlling access to the memory, an inverting circuit for inverting data read from the memory to generate inverted data, and a thermal stress calculation circuit for estimating a total amount of thermal stress applied to the ferroelectric memory by performing time integration of the temperature of the ferroelectric memory measured by the temperature sensor for a period of time from when the thermal stress calculation circuit receives the first signal to when the thermal stress calculation circuit receives the second signal, and calculating a length of time from when the first signal is received to when a value obtained by the time integration reaches the half of the estimated total amount of thermal stress; and upon receipt of the first signal, the control circuit saves data stored in the ferroelectric memory to the memory, and then starts writing of the inverted data into the ferroelectric memory when the time calculated by the thermal stress calculation circuit has elapsed, while upon receipt of the second signal, the control circuit stops the writing of the inverted data into the ferroelectric memory.

12. A data carrier system comprising:

a first memory, which is a ferroelectric memory;

a second memory;

a temperature sensor for measuring temperature of the first memory, outputting a first signal when the temperature exceeds a predetermined value, and outputting a second signal when the temperature falls below a predetermined value;

an inverting circuit for inverting data read from the second memory to generate inverted data; and a control circuit for making data access to the first and second memories, wherein upon receipt of the first signal, the control circuit saves data stored in the first memory to the second memory and then writes the data stored in the second memory and the inverted data alternately into the first memory, while upon receipt of the second signal, the control circuit writes the data stored in the second memory into the first memory.

13. A data carrier system comprising:

a first memory, which is a ferroelectric memory;

a second memory;

a temperature sensor for measuring temperature of the first memory, outputting a first signal when the temperature exceeds a predetermined value, and outputting a second signal when the temperature falls below a predetermined value;

an inverting circuit for inverting data read from the second memory to generate inverted data;

a thermal stress calculation circuit for estimating a total amount of thermal stress applied to the first memory by performing time integration of the temperature of the first memory measured by the temperature sensor for a period of time from when the thermal stress calculation circuit receives the first signal to when the thermal stress calculation circuit receives the second signal, and calculating a length of time from when the first signal is received to when a value obtained by the time integration reaches the half of the estimated total amount of thermal stress; and a control circuit for making data access to the first and second memories, wherein upon receipt of the first signal, the control circuit saves data stored in the first memory to the second memory, and then starts writing of the inverted data into the first memory when the time calculated by the thermal stress calculation circuit has elapsed, while upon receipt of the second signal, the control circuit stops the writing of the inverted data to the first memory.

14. A method for saving and restoring data stored in a ferroelectric memory, the method comprising the steps of:

(1) saving the data stored in the ferroelectric memory to a second memory, when temperature of the ferroelectric memory exceeds a predetermined value;

(2) after the step (1), canceling polarization of the ferroelectric memory; and (3) after the step (2), writing the data saved to the second memory back into the ferroelectric memory, when the temperature falls below a predetermined value.

15. A data carrier comprising:

a ferroelectric memory, a polarization canceling circuit for canceling polarization of the ferroelectric memory in accordance with an instruction given thereto, and a control circuit for making data access to the ferroelectric memory and controlling operation of the polarization canceling circuit, wherein upon receipt of a first instruction, the control circuit saves data stored in the ferroelectric memory to an external memory and then gives an instruction for canceling polarization to the polarization canceling circuit, while upon receipt of a second instruction, the control circuit writes the data saved to the external memory back into the ferroelectric memory.

16. The data carrier of claim 15, wherein when the control circuit gives the instruction for canceling polarization, the control circuit permits writing of data into the ferroelectric memory.

* * * * *